United States Patent
Adachi et al.

(10) Patent No.: US 10,493,592 B2
(45) Date of Patent: Dec. 3, 2019

(54) SEMICONDUCTOR MANUFACTURING APPARATUS AND MANUFACTURING METHOD OF SEMICONDUCTOR DEVICE

(71) Applicant: TOSHIBA MEMORY CORPORATION, Minato-ku (JP)

(72) Inventors: Masayoshi Adachi, Yokkaichi (JP); Jun Takagi, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 156 days.

(21) Appl. No.: 15/696,968

(22) Filed: Sep. 6, 2017

(65) Prior Publication Data
US 2018/0229345 A1 Aug. 16, 2018

(30) Foreign Application Priority Data
Feb. 14, 2017 (JP) .................................. 2017-024981

(51) Int. Cl.
| | |
|---|---|
| *B24B 37/10* | (2012.01) |
| *H01L 21/67* | (2006.01) |
| *H01L 21/687* | (2006.01) |
| *H01L 21/306* | (2006.01) |
| *B24B 37/013* | (2012.01) |

(52) U.S. Cl.
CPC .......... *B24B 37/107* (2013.01); *B24B 37/013* (2013.01); *H01L 21/30625* (2013.01); *H01L 21/6708* (2013.01); *H01L 21/67248* (2013.01); *H01L 21/67253* (2013.01); *H01L 21/68735* (2013.01); *H01L 21/68764* (2013.01)

(58) Field of Classification Search
CPC ............................ B24B 37/107; B24B 37/013
USPC ...................... 451/6, 41, 285-290
See application file for complete search history.

(56) References Cited

U.S. PATENT DOCUMENTS

| | | | | |
|---|---|---|---|---|
| 5,944,593 | A * | 8/1999 | Chiu ...................... | B24B 37/042 451/288 |
| 6,183,350 | B1 * | 2/2001 | Lin ........................ | B24B 37/042 451/285 |

(Continued)

FOREIGN PATENT DOCUMENTS

| | | |
|---|---|---|
| JP | 2000-311875 | 11/2000 |
| JP | 2008-302464 | 12/2008 |

(Continued)

*Primary Examiner* — George B Nguyen
(74) *Attorney, Agent, or Firm* — Oblon, McClelland, Maier & Neustadt, L.L.P.

(57) ABSTRACT

A semiconductor manufacturing apparatus according to the present embodiment has a polisher polishing a substrate. A holder holds the substrate and rotates the substrate with respect to the polisher while pressing the substrate toward the polisher. A supplier supplies a polishing solution onto the polisher. A first annular part is attached to the holder. The first annular part is located around the substrate and between the holder and the polisher, when polishing the substrate. A second annular part is attached to the holder. The second annular part is located around the first annular part and between the holder and the polisher, when polishing the substrate. The first annular part is movable relative to the second annular part or the second annular part is movable relative to the first annular part, in a rotation direction of the substrate or the holder.

15 Claims, 9 Drawing Sheets

(56) References Cited

U.S. PATENT DOCUMENTS

| | | | |
|---|---|---|---|
| 6,224,472 B1* | 5/2001 | Lai | B24B 37/32 451/288 |
| 6,334,810 B1 | 1/2002 | Song et al. | |
| 6,447,380 B1* | 9/2002 | Pham | B24B 37/32 451/288 |
| 6,454,637 B1* | 9/2002 | Gotkis | B24B 37/30 451/287 |
| 6,648,734 B2* | 11/2003 | Chin | B24B 37/32 451/287 |
| 7,029,375 B2* | 4/2006 | Phang | B24B 37/32 451/285 |
| 7,326,105 B2* | 2/2008 | Chandrasekaran | B24B 37/32 451/285 |
| 8,858,302 B2* | 10/2014 | Kim | B24B 37/32 451/285 |
| 2005/0037694 A1* | 2/2005 | Taylor | B24B 37/32 451/41 |
| 2007/0298693 A1* | 12/2007 | Ichinoshime | B24B 37/32 451/285 |
| 2013/0196573 A1 | 8/2013 | Fukushima et al. | |

FOREIGN PATENT DOCUMENTS

| | | |
|---|---|---|
| JP | 2008-307674 | 12/2008 |
| JP | 2013-157541 | 8/2013 |
| JP | 2014-86568 | 5/2014 |

\* cited by examiner

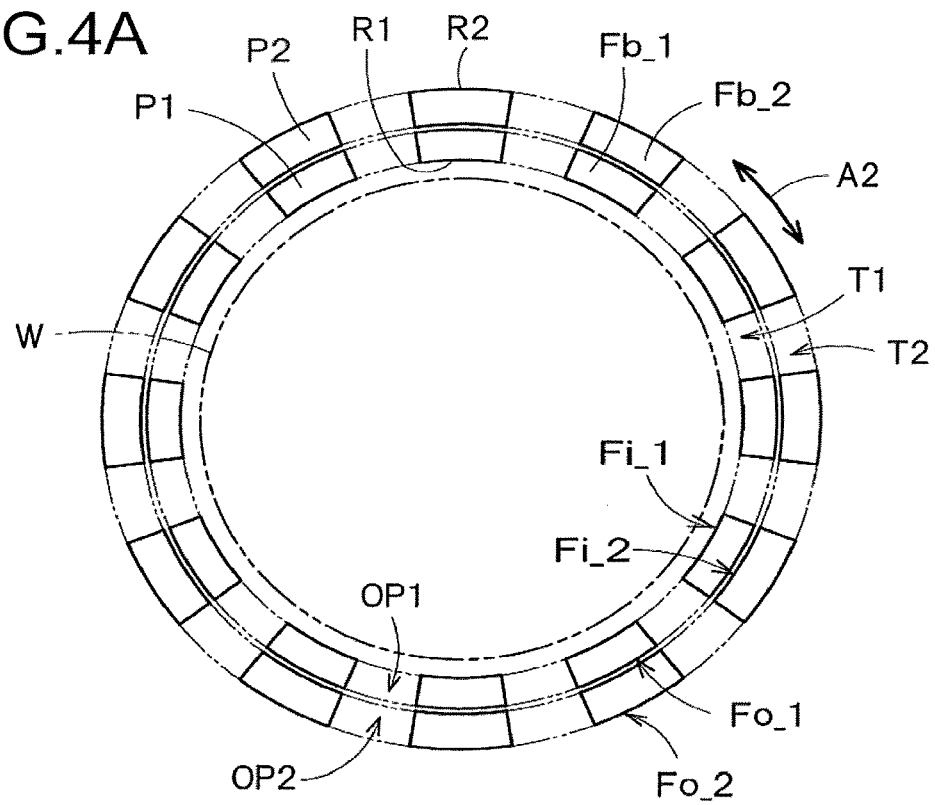
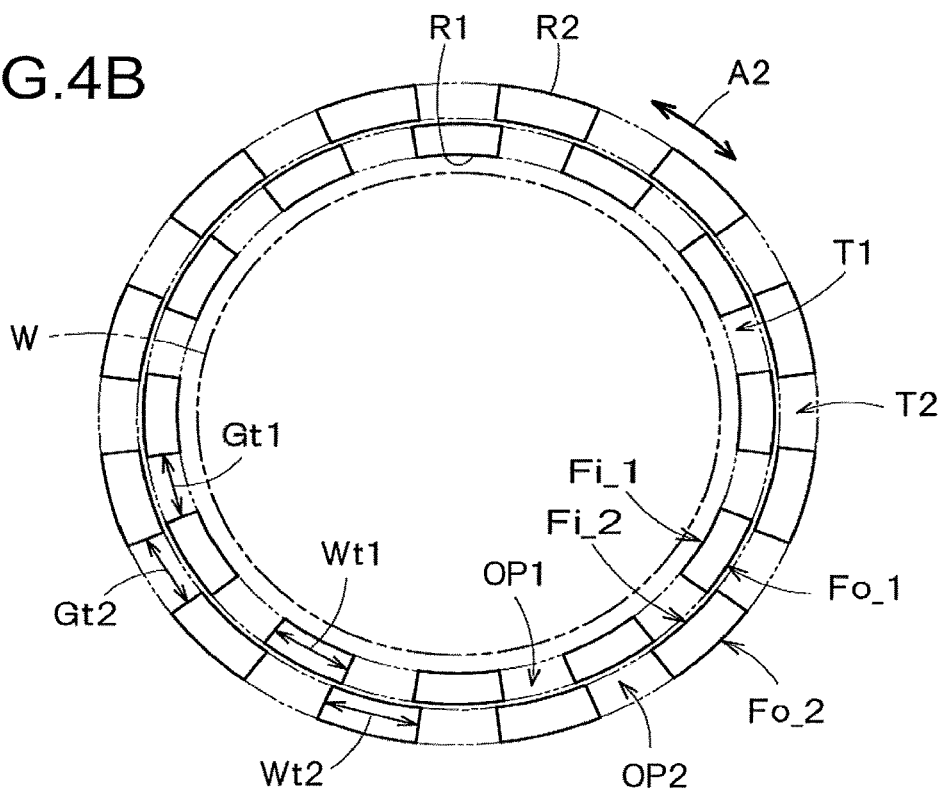

SEMICONDUCTOR MANUFACTURING APPARATUS AND MANUFACTURING METHOD OF SEMICONDUCTOR DEVICE

CROSS REFERENCE TO RELATED APPLICATIONS

This application is based upon and claims the benefit of priority from the prior Japanese Patent Application No. 2017-024981, filed on Feb. 14, 2017, the entire contents of which are incorporated herein by reference.

FIELD

The embodiments of the present invention relate to a semiconductor manufacturing apparatus and a manufacturing method of a semiconductor device.

BACKGROUND

A CMP (Chemical Mechanical Polishing) method or the like is used for polishing a semiconductor substrate. In the CMP method, a carrier and a platen rotate in the state where the carrier holds a semiconductor substrate to press the semiconductor substrate onto a polish pad provided on the platen. During the rotation, the polish pad polishes the semiconductor substrate while slurry containing fine abrasive grains is being supplied onto the polish pad.

However polishing while supplying the slurry is a cause of raising a cost of manufacturing semiconductor devices. Moreover, reduction in a slurry supply amount decreases a polishing speed, so that the semiconductor substrate cannot be efficiently polished.

BRIEF DESCRIPTION OF THE DRAWINGS

FIGS. 4A and 4B are bottom views showing examples of the configurations of the first and second retainer rings;

DETAILED DESCRIPTION

A semiconductor manufacturing apparatus according to the present embodiment has a polisher polishing a substrate. A holder holds the substrate and rotates the substrate with respect to the polisher while pressing the substrate toward the polisher. A supplier supplies a polishing solution onto the polisher. A first annular part is attached to the holder. The first annular part is located around the substrate and between the holder and the polisher, when polishing the substrate. A second annular part is attached to the holder. The second annular part is located around the first annular part and between the holder and the polisher, when polishing the substrate. The first annular part is movable relative to the second annular part or the second annular part is movable relative to the first annular part, in a rotation direction of the substrate or the holder.

Embodiments will now be explained with reference to the accompanying drawings.

(First Embodiment)

Figure 1:
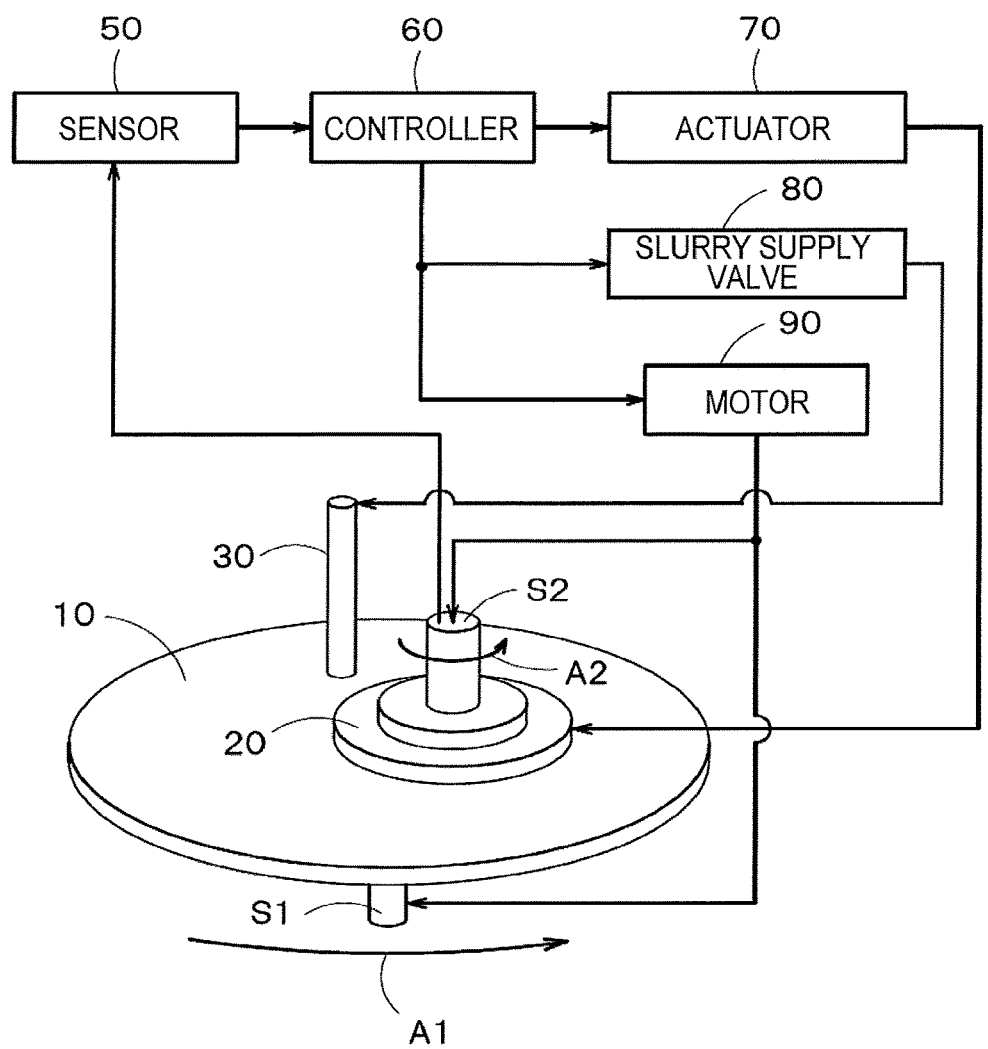
FIG. 1 is a schematic view showing an example of the configuration of a polishing apparatus according to a first embodiment.

FIG. 1 is a schematic view showing an example of the configuration of a polishing apparatus 1 according to a first embodiment. The polishing apparatus 1 as a semiconductor manufacturing apparatus is, for example, an apparatus for polishing a substrate W or a material film on the substrate W (hereinafter, simply referred to as a substrate W), with a CMP method. The substrate W may, for example, be a semiconductor substrate such as a silicon substrate.

The polishing apparatus 1 is provided with a platen 10, a carrier 20, a slurry supply nozzle 30, a sensor 50, a controller 60, an actuator 70, a slurry supply valve 80, and a motor 90.

The platen 10, as a polisher, has a polish pad (not shown) thereon, rotatable about a shaft S1 as indicated by an arrow A1. The platen 10 polishes the substrate W with the polish pad while rotating.

The carrier 20, as a holder, holds the substrate W, rotatable about a shaft S2 as indicated by an arrow A2. The carrier 20 rotates the substrate W with respect to the platen 10 while pressing the substrate W toward the platen 10, thereby polishing the substrate W.

The slurry supply nozzle 30, as a supplier, supplies slurry on the platen 10, as a polishing solution. The slurry is a chemical containing abrasive grains, for polishing the substrate W together with the polish pad, between the substrate W and the platen 10.

The sensor 50 is provided to the platen 10 or the carrier 20, for detecting a parameter that indicates a polished state of the substrate W. The parameter is, for example, any one of the temperature or vibration of the substrate W while being polished, the temperature or vibration of a first retainer ring R1, the temperature or vibration of a second retainer ring R2, a current value of or an eddy current value of the motor 90 that drives the platen 10 or the carrier 20, the reflected light intensity on a polished surface of the substrate W, the time from the start of polishing the substrate W, the time from the halt of slurry supply, etc., or the combination of any of these parameters. Therefore, the sensor 50 is any one of a temperature sensor, a vibration sensor, a current sensor, an optical sensor, a timer, etc., or the combination of any of these sensors.

The controller 60 controls the actuator 70, the slurry supply valve 80, the slurry supply nozzle 30, and the motor 90, based on a measured value of the parameter detected by the sensor 50.

The actuator 70, as a driver, moves the first or the second retainer ring R1 or R2 in a rotation direction A2 of the carrier 20 (in other words, the substrate W) in relative movement, under control by the controller 60. The actuator 70 may, for example, be a motor, a piezoelectric device, etc. The configuration and the operation of the first and second retainer rings R1 and R2 will be described later with reference to FIGS. 3A to 4B.

The slurry supply valve 80, as a supplier, supplies the slurry onto the platen 10 via the slurry supply nozzle 30, under control by the controller 60.

The motor 90 is provided to each of the platen 10 and the carrier 20, for rotating the platen 10 and the carrier 20, under control by the controller 60.

Figure 2A:
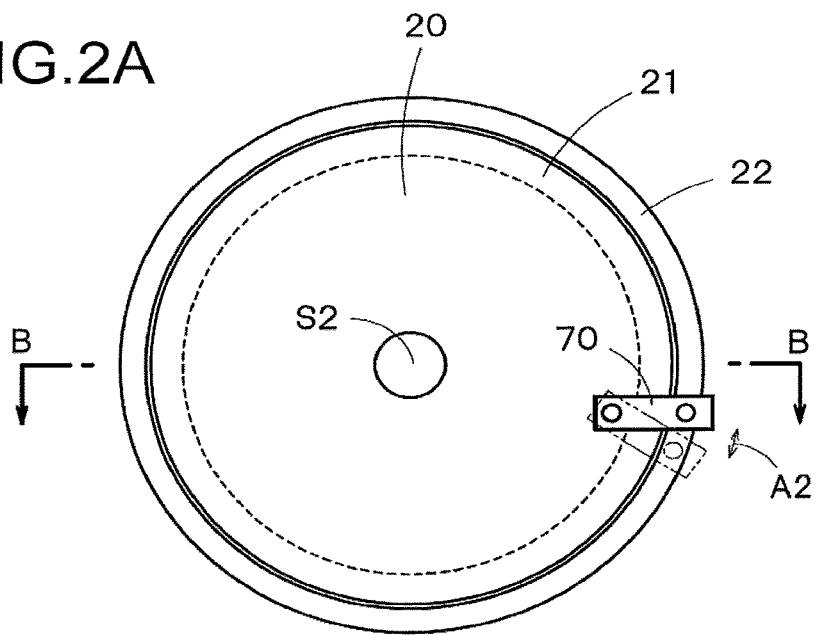
FIGS. 2A and 2B are a plan view and a sectional view, respectively, showing an example of the detailed configuration of a carrier.
Figure 2B:
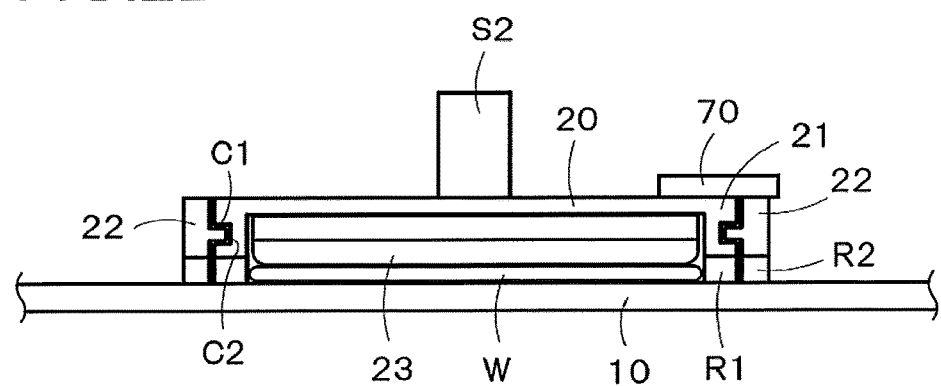

FIGS. 2A and 2B are a plan view and a sectional view, respectively, showing an example of the detailed configuration of the carrier 20. FIG. 2B is a sectional view along the lines B-B of FIG. 2A.

The carrier 20 is, as shown in FIG. 2A, almost circular and rotatable about the shaft S2. The carrier 20 includes a first carrier part 21 closer to the carrier 20 and a second carrier part 22 comparatively apart from the shaft S2. The first carrier part 21 is fixed to the shaft S2, rotatable with the shaft S2. The first carrier part 21 is, as shown in FIG. 2B, almost cylindrical, having a membrane member 23 therein. The first carrier part 21 has a larger outer periphery than the substrate W so that the first carrier part 21 can hold the substrate W therein. The first carrier part 21 can accommodate the substrate W in between it and the platen 10. The membrane member 23 swells by taking a gas therein to press the substrate W toward the platen 10.

The second carrier part 22 is provided separately from the first carrier part 21, around the first carrier part 21. The second carrier part 22 is connected to the first carrier part 21 via the actuator 70, capable of relative movement in the rotation direction A2 within an operation range of the actuator 70. Therefore, when the actuator 70 is in operation, the second carrier part 22 moves relative to the first carrier part 21 in the rotation direction A2. On the contrary, when the actuator 70 is out of operation, the second carrier part 22 rotates together with the first carrier part 21 about the shaft S2.

As shown in FIG. 2B, the first carrier part 21 is provided with a concave part C1 at its outer surface and the second carrier part 22 is provided with a convex part C2 at its inner surface. The concave part C1 and the convex part C2 are extended along the outer periphery of the first carrier part 21 or the inner periphery of the second carrier part 22. The convex part C2 is fit into the concave part C1 so as to be slidable to each other. The concave part C1 is longer than the convex part C2, so that the second carrier part 22 can move (rotate) relative to the first carrier part 21 in the direction A2, without being fallen off from the first carrier part 21. For example, a metal such as a stainless steel is used for the concave and convex parts C1 and C2.

In the present embodiment, the first carrier part 21 is fixed to the shaft S2 and the second carrier part 22 is movable relative to the first carrier part 21. However, although not shown, conversely, the second carrier part 22 may be fixed to the shaft S2, with the first carrier part 21 movable relative to the second carrier part 22.

At the edge of the first carrier part 21, the first retainer ring R1 is attached as a first annular part. The first retainer ring R1 is located between the first carrier part 21 and the platen 10, and around the substrate W, while the substrate W is being polished. The first retainer ring R1 is fixed to the first carrier part 21, rotatable in the same manner as the first carrier part 21.

At the edge of the second carrier part 22, the second retainer ring R2 is attached as a second annular part. The second retainer ring R2 is located between the second carrier part 22 and the platen 10, and around the substrate W, while the substrate W is being polished. The second retainer ring R2 is fixed to the second carrier part 22, rotatable in the same manner as the second carrier part 22. Therefore, the second retainer ring R2 is movable relative to the first retainer ring R1 in the direction A2.

For the first and second retainer rings R1 and R2, for example, a resin or the like is used, so that the first and second retainer rings R1 and R2 are gradually polished as the substrate W is polished. Therefore, the first and second retainer rings R1 and R2 are detachably attached to the first and second carrier parts 21 and 22, respectively, so as to be replaceable.

Figure 3A:
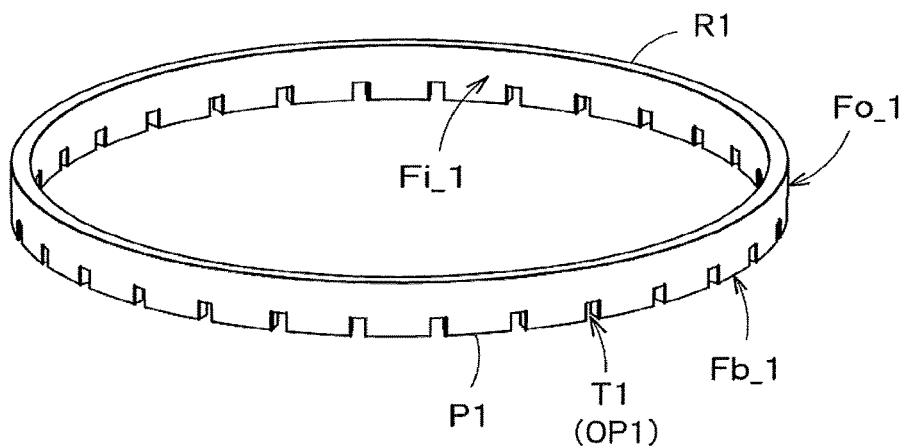
FIGS. 3A and 3B are perspective views showing an example of the configurations of first and second retainer rings, respectively.
Figure 3B:
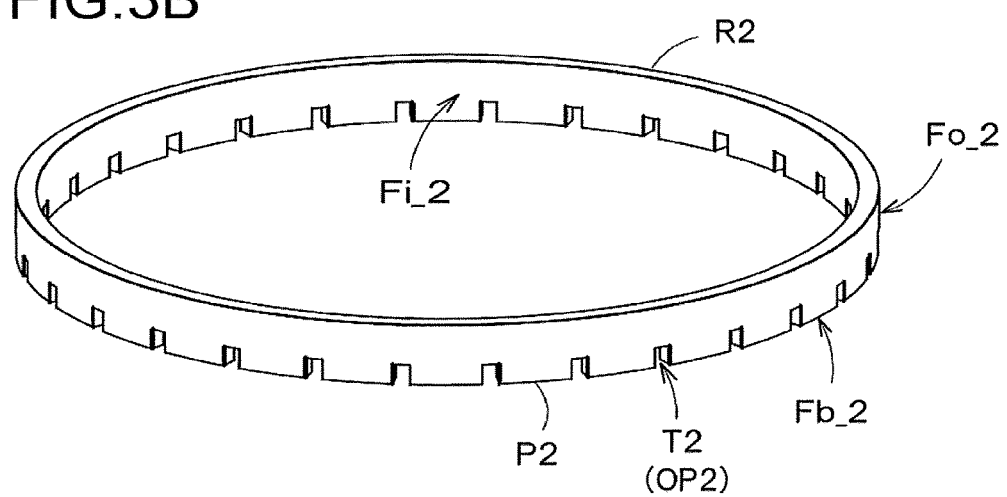

FIGS. 3A and 3B are perspective views showing an example of the configurations of the first and second retainer rings R1 and R2, respectively. The first retainer ring R1 in FIG. 3A has a plurality of first trenches T1 on a contact surface Fb_1 with respect to the platen 10. Each first trench T1 is extended from an inner surface Fi_1 of the first retainer ring R1 to an outer surface Fo_1 thereof. While polishing the substrate W, when the first retainer ring R1 is in contact with the upper surface of the platen 10, the first trench T1 becomes a first opening OP1 that communicates from the inner surface Fi_1 to the outer surface Fo_1 of the first retainer ring R1, between the first retainer ring R1 and the platen 10. In other words, when the first retainer ring R1 is placed on the platen 10, the first trench T1 and the platen 10 forms the first opening OP1. The first trench T1 has, for example, an almost rectangular or arc shape. There is no particular limitation on the height (depth) and the number of the first trenches T1 as long as the polishing solution can fully pass through the first opening OP1. Nevertheless, it is preferable that the plurality of first trenches T1 have almost the same shape and size.

It can be said that, with the first trenches T1, the first retainer ring R1 has a plurality of convex parts P1 at its lower part. When the first trenches T1 have almost the same shape and size, the convex parts P1 also have almost the same shape and size.

The second retainer ring R2 in FIG. 3B has a plurality of second trenches T2 on a contact surface Fb_2 with respect to the platen 10. Each second trench T2 is extended from an inner surface Fi_2 of the second retainer ring R2 to an outer surface Fo_2 thereof. While polishing the substrate W, when the second retainer ring R2 is in contact with the upper surface of the platen 10, the second trench T2 becomes a second opening OP2 that communicates from the inner surface Fi_2 to the outer surface Fo_2 of the second retainer ring R2, between the second retainer ring R2 and the platen 10. In other words, when the second retainer ring R2 is placed on the platen 10, the second trench T2 and the platen 10 forms the second opening OP2. The second trench T2 has, for example, an almost rectangular or arc shape. There is no particular limitation on the height (depth) and the number of the second trenches T2 as long as the polishing solution can fully pass through the second opening OP2. Nevertheless, it is preferable that the plurality of second trenches T2 have almost the same shape and size. Moreover, it is preferable that the number of the second trenches T2 is equal to that of the first trenches T1. Furthermore, it is preferable that the height (depth) of the second trenches T2 is almost equal to that of the first trenches T1.

It can be said that, with the second trenches T2, the second retainer ring R2 has a plurality of convex parts P2 at its lower part. When the second trenches T2 have almost the same shape and size, the convex parts P2 also have almost the same shape and size. It is preferable that the number of the convex parts P2 is equal to that of the convex parts P1.

Moreover, it is preferable that the height of the convex parts P2 is almost equal to that of the convex parts P1. Having the configuration described above, the operation such as illustrated in FIGS. 4A and 4B is possible.

FIGS. 4A and 4B are bottom views showing examples of the configurations of the first and second retainer rings R1 and R2. In FIGS. 4A and 4B, the substrate W is virtually disposed inside the first retainer ring R1. The first retainer ring R1 is disposed inside the second retainer ring R2. When polishing the substrate W, the first and second retainer rings R1 and R2 are arranged as shown in FIG. 4A or 4B. In FIGS. 4A and 4B, the first and second retainer rings R1 and R2 are schematically illustrated for easy understanding, the configurations of which may not always the same as those of the first and second retainer rings R1 and R2 shown in FIGS. 3A and 3B, respectively.

In FIG. 4A, the first trenches T1 and the second trenches T2 are connected to each other from the inner surface Fi_1 of the first retainer ring R1 to the outer surface Fo_2 of the second retainer ring R2 on bottom surfaces (contact surfaces with respect to the platen 10) Fb_1 and Fb_2 of the first and second retainer rings R1 and R2, respectively. In other words, when each first trench T1 and the associated second trench T2 meet each other (that is, the convex parts P1 and P2 meet each other), the above-described first opening OP1 and second opening OP2 communicate with each other in a direction (a radially inward or outward direction of the first and second retainer rings R1 and R2) almost perpendicular to the direction A2 between the inner surface Fi_1 of the first retainer ring R1 and the outer surface Fo_2 of the second retainer ring R2. According to the configuration described above, when polishing the substrate W, the polishing solution supplied onto the platen 10 enters into the carrier 20 via the first and second openings OP1 and OP2, and then supplied in between the substrate W and the platen 10. As long as the first and second openings OP1 and OP2 are communicable with each other, the first and second trenches T1 and T2 may be inclined and extended in some degree from the radially inward or outward direction of the first and second retainer rings R1 and R2.

By contrast, in FIG. 4B, the first trenches T1 and the second trenches T2 are blocked from each other between the inner surface Fi_1 of the first retainer ring R1 and the outer surface Fo_2 of the second retainer ring R2 on the bottom surfaces (contact surfaces with respect to the platen 10) Fb_1 and Fb_2 of the first and second retainer rings R1 and R2, respectively. In other words, when each first trench T1 and the associated second trench T2 are displaced from each other (that is, the convex parts P1 and P2 are displaced from each other), the first opening OP1 is closed by an inner surface Fi_2 of each convex part P2 of the second retainer ring R2 and the second opening OP2 is closed by an outer surface Fo_1 of each convex part P1 of the first retainer ring R1. As shown in FIG. 4B, in order for the inner surface Fi_2 of each convex part P2 to close the first opening OP1, the convex part P2 is required have a width Wt2 larger than a width (gap) Gt1 of each first trench T1 in the direction A2. In other words, a gap (Wt2) between the second trenches T2 adjacent to each other is required to be larger than the width (gap) Gt1 of each first trench T1. In order for the outer surface Fo_1 of each convex part P1 to close the second opening OP2, the convex part P1 is required to have a width Wt1 larger than a width (gap) Gt2 of each second trench T2 in the direction A2. In other words, a gap (Wt1) between the first trenches T1 adjacent to each other is required to be larger than the width (gap) Gt2 of each second trench T1. Having the configuration described above, when polishing the substrate W, the first opening OP1 and the second opening OP2 do not communicate with each other, so that the slurry inside the carrier 20 can be held between the substrate W and the platen 10 in some degree, without being leaked to the outside of the carrier 20 too much.

Nevertheless, the slurry is not tightly held between the platen 10 and the first and second retainer rings R1 and R2. During polishing, the slurry is gradually leaked out from between the platen 10 and the first and second retainer rings R1 and R2. For this reason, in the present embodiment, when the slurry becomes insufficient, the actuator 70 shown in FIG. 2A moves the second retainer ring R2 relative to the first retainer ring R1 to make the first and second openings OP1 and OP2 communicate with each other as shown in FIG. 4A.

When the first and second openings OP1 and OP2 communicate with each other, the slurry supply valve 80 and the slurry supply nozzle 30 supply the slurry onto the platen 10. In this way, the slurry is supplied to the substrate W inside the carrier 20 via the first and second openings OP1 and OP2. After supplying the slurry for a predetermined time, the actuator 70 moves the second retainer ring R2 relative to the first retainer ring R1 in the opposite direction to close (block) the first and second openings OP1 and OP2 as shown in FIG. 4B. When the first and second openings OP1 and OP2 are closed, the slurry supply valve 80 and the slurry supply nozzle 30 halt the supply of slurry.

As described above, according to the present embodiment, the second retainer ring R2 is rotatable in the rotation direction A2 relative to the first retainer ring R1. In supplying the slurry when polishing the substrate W, the actuator 70 makes the first opening OP1 (first trench T1) and the second opening OP2 (second trench T2) meet each other. When meeting each other, the first opening OP1 and the second opening OP2 communicate with each other between the inside and the outside of the carrier 20, so that the slurry is supplied in between the substrate W and the platen 10 via the first and second openings OP1 and OP2. After supplying the slurry, the actuator 70 displaces the first opening OP1 (first trench T1) and the second opening OP2 (second trench T2) from each other, so that the carrier 20 is blocked inside and outside to hold the slurry therein. Therefore, the slurry supply valve 80 and the slurry supply nozzle 30 may halt the supply of slurry until the slurry inside the carrier 20 becomes insufficient. As described above, since the first and second retainer rings R1 and R2 can hold the slurry inside the carrier 20, the polishing apparatus 1 according to the present embodiment can intermittently supply the slurry according to needs, without being required to continuously supply the slurry during polishing the substrate W. As a result, the polishing apparatus 1 according to the present embodiment can restrict the slurry supply amount to reduce the cost of manufacturing semiconductor devices. Together with that, since the slurry is supplied in between the substrate W and the platen 10 when the slurry is insufficient, the polishing apparatus 1 can efficiently polish the substrate W without reducing the polishing speed.

Subsequently, the operation of the polishing apparatus 1 will be described.

Figure 5:
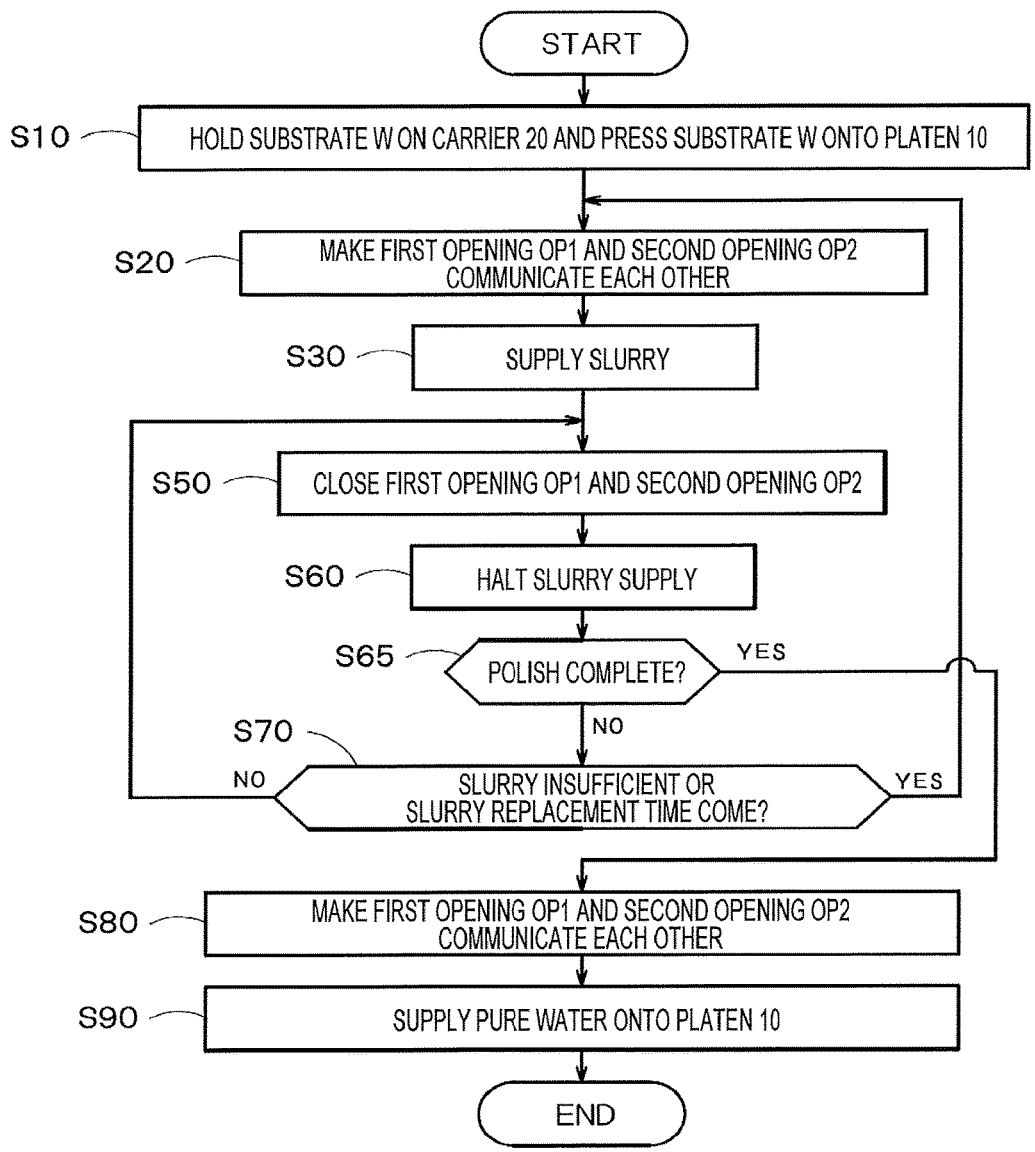
FIG. 5 is a flowchart showing an example of a polishing method using the polishing apparatus according to the first embodiment.
Figure 6A:
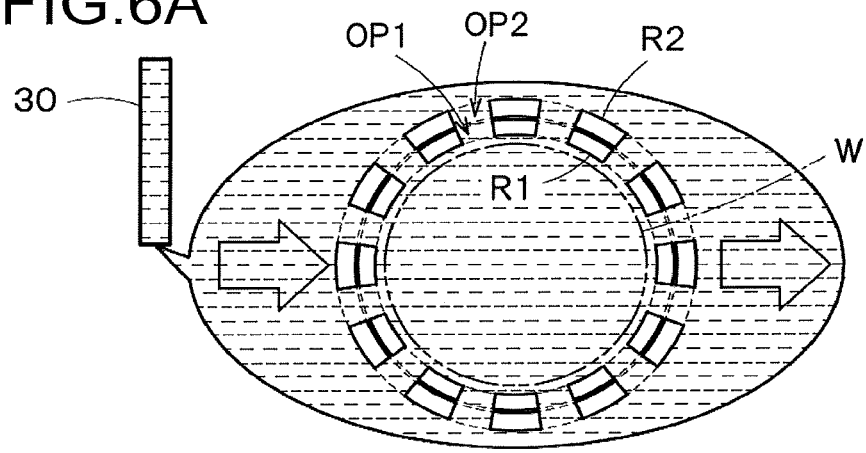
FIGS. 6A to 6C are conceptual views illustrating the polishing method using the polishing apparatus according to the first embodiment.
Figure 6B:
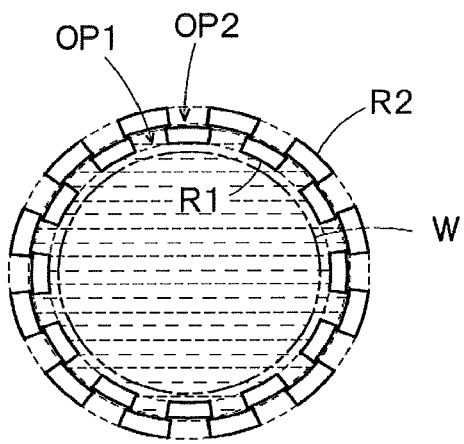
Figure 6C:
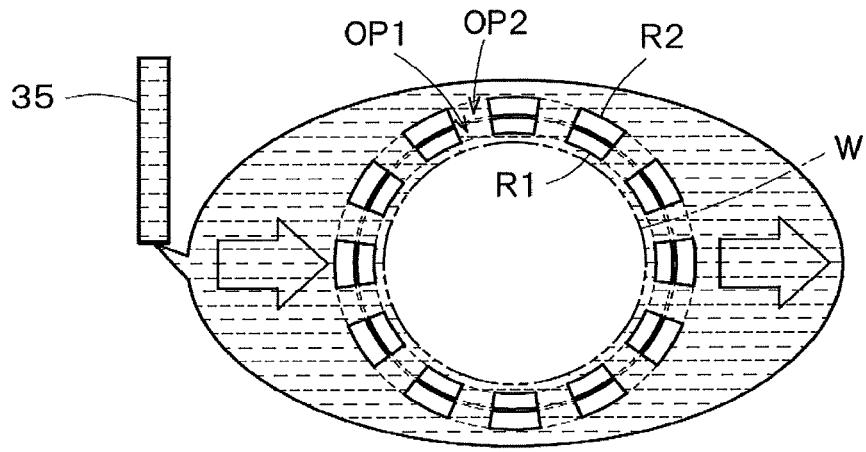

FIG. 5 is a flowchart showing an example of a polishing method using the polishing apparatus 1 according to the first embodiment. FIGS. 6A to 6C are conceptual views illustrating the polishing method using the polishing apparatus 1 according to the first embodiment.

At first, the carrier 20 holds the substrate W and presses the substrate W onto the platen 10 (S10).

Subsequently, as shown in FIG. 6A, the actuator 70 moves the second retainer ring R2 relative to the first retainer ring R1 to make the first opening OP1 and the second opening OP2 meet each other. When meeting each other, the first opening OP1 and the second opening OP2 communicate each other between the inside and the outside of the carrier 20 (S20).

Subsequently, the slurry supply valve 80 and the slurry supply nozzle 30 supply the slurry onto the platen 10 (S30). When being supplied, the slurry passes through the first and second openings OP1 and OP2, and then is supplied in between the substrate W and the platen 10 inside the carrier 20.

Subsequently, the platen 10 and the carrier 20 are rotated to start polishing of the substrate W.

After supplying the slurry for a predetermined time, as shown in FIG. 6B, the actuator 70 moves the second retainer ring R2 relative to the first retainer ring R1 so as to displace the first opening OP1 and the second opening OP2 from each other. In this way, the first opening OP1 and the second opening OP2 are closed to block the carrier 20 inside and outside (S50). Simultaneously with this or just after this, the slurry supply nozzle 30 and the slurry supply valve 80 halt the supply of slurry (S60). When the supply of slurry is halted, since the first opening OP1 and the second opening OP2 are closed, the slurry inside the carrier 20 is held between the substrate W and the platen 10 and is used for polishing the substrate W.

The steps S50 and S60 are repeated until the slurry becomes insufficient or the slurry replacement time comes (NO in S70).

When the slurry becomes insufficient or the slurry replacement time comes (YES in S70), as shown in FIG. 6A, the actuator 70 makes again the first opening OP1 and the second opening OP2 meet each other to communicate the inside and the outside of the carrier 20 (S20). Subsequently, the slurry supply valve 80 and the slurry supply nozzle 30 supply the slurry onto the platen 10 (S30).

After supplying the slurry for a predetermined time, as shown in FIG. 6B, the actuator 70 displaces the first opening OP1 and the second opening OP2 from each other to close the first opening OP1 and the second opening OP2 (S50). Simultaneously with this or just after this, the slurry supply nozzle 30 and the slurry supply valve 80 halt the supply of slurry (S60).

The steps S20 to S60 are repeated when the slurry becomes insufficient or should be replaced with a new one during polishing the substrate W. The slurry insufficient state or the slurry replacement time may be determined using the above-described parameters. For example, after the step S20, the controller 60 may perform the steps S20 to S60 cyclically whenever a predetermined time passes. Accordingly, the polishing apparatus 1 can automatically move the second retainer ring R2 with respect to the first retainer ring R1 and can automatically perform the supply of slurry and the halt of supply. The other parameters will be explained in the following modifications. As described above, the polishing apparatus 1 can efficiently polish the substrate W while restricting the slurry supply amount, without reducing the polishing speed.

Until polishing is complete (NO in S65), the steps S20 to S70 are repeated.

When polishing is complete (YES in S65), in order to clean the substrate W and the inside of the carrier 20, as shown in FIG. 6C, the actuator 70 makes again the first opening OP1 and the second opening OP2 meet each other to communicate the carrier 20 inside and outside (S80).

Subsequently, a pure-water supply nozzle 35 supplies pure water onto the platen 10 (S90). Accordingly, the pure water passes through the first and second openings OP1 and OP2, and is supplied in between the substrate W and the platen 10 inside the carrier 20, so that the slurry is replaced with the pure water. In this way, the polished surface of the substrate W is cleaned.

Thereafter, the substrate W is cleaned or dried on the carrier 20 or after detached from the carrier 20. Then, the polish process completes.

As described above, according to the present embodiment, when supplying the slurry while polishing the substrate W, the actuator 70 makes the first opening OP1 and the second opening OP2 communicate with each other to allow the slurry pass therethrough. After the supply of slurry, the actuator 70 displaces the first opening OP1 and the second opening OP2 from each other to halt the supply of slurry. When the slurry becomes insufficient or the slurry replacement times comes, the actuator 70 makes the first opening OP1 and the second opening OP2 communicate with each other to supply the slurry. By repeating the above steps, without requiring to continuously supply the slurry, the polishing apparatus 1 can restrict the slurry supply amount and efficiently polish the substrate W.

(Modification 1)

In the first embodiment, after the step S60, the controller performs the step S20 to S60 cyclically whenever the predetermined time passes. By contrast, in the present modification, the controller 60 determines that the slurry becomes insufficient or the slurry replacement time comes when a parameter becomes lower than or exceeds a threshold value. Then, the controller 60 controls the actuator 70 to make the first and second openings OP1 and OP2 communicate with each other and controls the slurry supply valve 80 to supply the slurry for a predetermined time.

For example, the sensor 50 is a temperature sensor in the case where the parameter is a temperature of the substrate W, the first retainer ring R1 or the second retainer ring R2, during polishing. The temperature sensor may be installed near the substrate W of the carrier 20 or near the first or the second retainer ring R1 or R2.

Figure 7A:
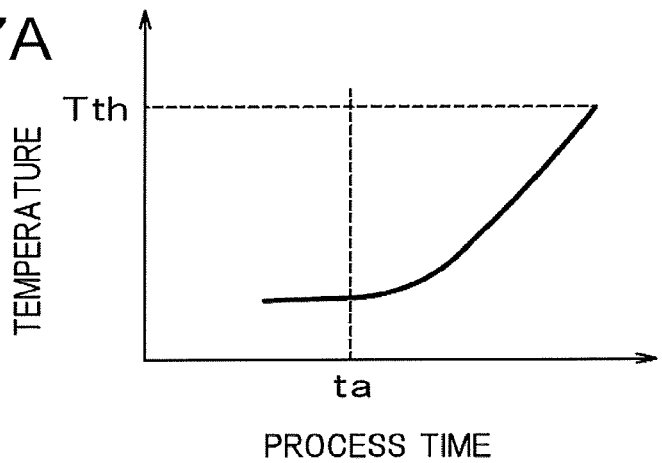
FIGS. 7A to 7C are graphs in the case where a parameter is a temperature, a current value (TCM (Torque Current Monitor), and an eddy current sensor (RECM (Reactance-Eddy Current Monitor)) value, respectively.
Figure 8:
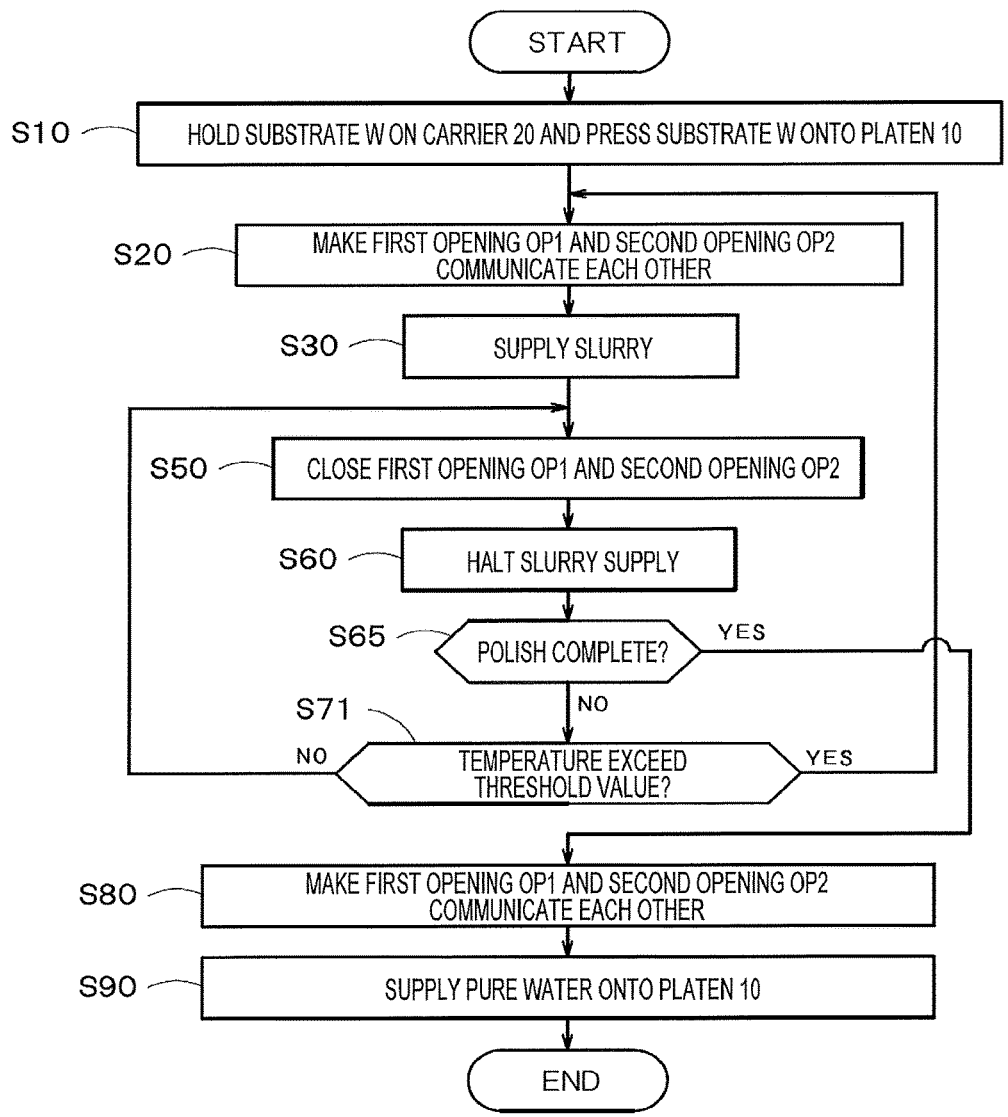
FIG. 8 is a flowchart showing an example of a polishing method using a polishing apparatus according to a modification.

FIG. 7A is a graph in the case where the parameter is a temperature, in which the ordinate indicates a temperature of the substrate W, the first retainer ring R1 or the second retainer ring R2, and the abscissa indicates a polish time. FIG. 8 is a flowchart showing an example of a polishing method using the polishing apparatus 1 according to the present modification.

Firstly, the steps S10 to S60 are performed.

At the initial stage of supplying the slurry, the temperature is extremely lower than a threshold value Tth. However, the temperature gradually rises after a time to at which the supply of slurry is halted. This is because even though the first and second openings OP1 are OP2 are closed, the amount of slurry inside the carrier 20 is gradually reduced, so that frictional heat is generated between the substrate W or the first and second retainer rings R1 and R2, and the platen 10.

Until the temperature exceeds the threshold value Tth (NO in S71), the controller 60 repeats the steps S50 to S65.

When the temperature exceeds the threshold value Tth (YES in S71), the controller 60 performs the steps S20 and S30. Through the steps, the slurry is supplied inside the carrier 20, so that the temperature lowers.

Thereafter, until polishing completes (NO in S65), the steps S20 to S71 are repeated. The operation to be performed when polishing completes (YES in S65) is the same as that of the first embodiment.

(Modification 2)

Figure 7B:
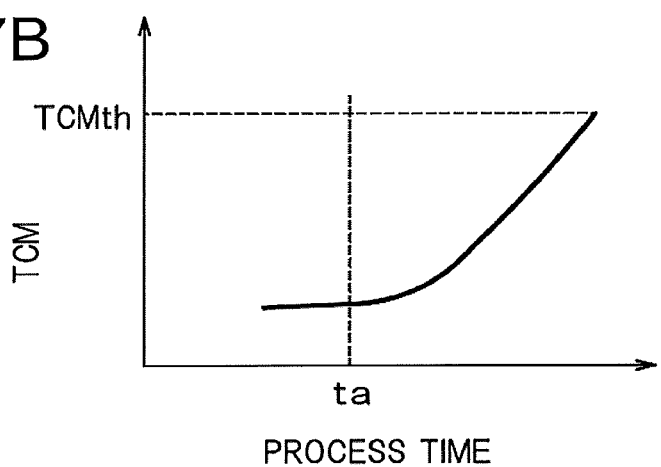

What is described above is also applied to other parameters. For example, FIG. 7B is a graph in the case where the parameter is a current value (TCM (Torque Current Monitor) of the motor 90. The flowchart in this case is easily understood by referring to FIG. 8 and hence is omitted.

Firstly, the steps S10 to S60 are performed.

After the time to at which the supply of slurry is halted, a TCM value gradually increases. This is because even though the first and second openings OP1 are OP2 are closed, the amount of slurry inside the carrier 20 is gradually reduced, so that friction force is increased between the substrate W or the first and second retainer rings R1 and R2, and the platen 10.

Instead of what is performed in the step S71 of the modification 1, the controller 60 compares the TCM value with a threshold value TCMth. The controller 60 repeats the steps S50 to S65 until the TCM value exceeds the threshold value TCMth (NO in S71).

When the TCM value exceeds the threshold value TCMth (YES in S71), the controller 60 performs the steps S20 and S30. Through the steps, the slurry is supplied inside the carrier 20, so that the TCM value decreases.

Thereafter, the steps S20 to S71 are repeated until polishing completes (NO in S65). The operation when polishing completes (YES in S65) is the same as that of the first embodiment.

(Modification 3)

Figure 7C:
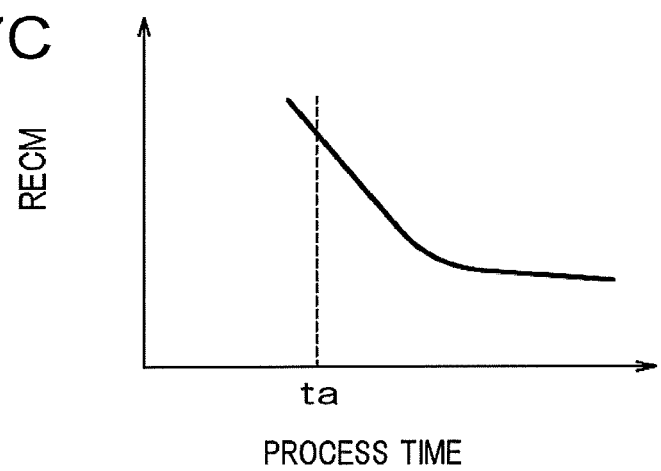

For example, FIG. 7C is a graph in the case where the parameter is an eddy current sensor (RECM (Reactance-Eddy Current Monitor)) value. The flowchart in this case is easily understood by referring to FIG. 8 and hence is omitted.

Firstly, the steps S10 to S60 are performed. The RECM detects a thickness of the substrate W by measuring a coil inductance generated due to an eddy current loss. Therefore, in FIG. 7C, the RECM value corresponds to the thickness of the substrate W and the absolute value of a slope (change per unit of time) of the RECM value corresponds to the polishing speed.

After the time to at which the supply of slurry is halted, the speed of decrease in the RECM value (the slope absolute value) is blunted (lowered). This is because even though the first and second openings OP1 are OP2 are closed, the amount of slurry inside the carrier 20 is gradually reduced, so that the polishing speed lowers.

Instead of what is performed in the step S71 of the modification 1, the controller 60 compares the slope absolute value of the RECM value with a threshold value. The controller 60 repeats the steps S50 to S65 until the slope absolute value of the RECM value becomes smaller than the threshold value (NO in S71). The controller repeats the steps S50 to S65.

When the slope absolute value of the RECM value becomes smaller than the threshold value (YES in S71), the controller 60 performs the steps S20 and S30. Through the steps, the slurry is supplied inside the carrier 20, so that the slope absolute value of the RECM value increases. In other words, the polishing speed to the substrate W increases to recover.

Thereafter, until polishing completes (NO in S65), the steps S20 to S71 are repeated. The operation to be performed when polishing completes (YES in S65) is the same as that of the first embodiment.

(Modification 4)

Although not shown, in the case where the parameter is vibration of the substrate W and the first and second retainer rings R1 and R2, a vibration sensor installed in the carrier 20 measures vibration of the substrate W. After the supply of slurry is halted, the vibration gradually becomes intense. This is because even though the first and second openings OP1 are OP2 are closed, the amount of slurry inside the carrier 20 is gradually reduced, so that the resistance between the substrate W and the platen 10 increases.

Instead of what is performed in the step S71 of the modification 1, the controller 60 compares the vibration with a threshold value. The controller 60 repeats the steps S50 to S65 until the vibration exceeds the threshold value.

When the vibration exceeds the threshold value (YES in S71), the controller 60 performs the steps S20 and S30. Through the steps, the slurry is supplied inside the carrier 20, so that the vibration decreases.

Thereafter, until polishing completes (NO in S65), the steps S20 to S71 are repeated. The operation to be performed when polishing completes (YES in S65) is the same as that of the first embodiment.

(Modification 5)

Although not shown, in the case where the parameter is a waveform change in reflected light intensity on the polished surface of the substrate W, an optical sensor installed in the platen 10 measures the waveform change in reflected light intensity on the polished surface of the substrate W. The wavelength of reflected light intensity corresponds the thickness of the substrate W and the change in the wavelength of reflected light intensity per unit of time (hereinafter, the rate of wavelength change) corresponds to the polishing speed.

Therefore, after the supply of slurry is halted, the rate of wavelength change in reflected light intensity gradually becomes smaller. This is because even though the first and second openings OP1 are OP2 are closed, the amount of slurry inside the carrier 20 is gradually reduced, so that the polishing speed decreases.

Instead of what is performed in the step S71 of the modification 1, the controller 60 compares the rate of wavelength change in reflected light intensity with a threshold value. The controller 60 repeats the steps S50 to S65 until the rate of wavelength change in reflected light intensity becomes smaller than the threshold value (NO in S71). The controller 60 repeats the steps S50 to S65.

When the rate of wavelength change in reflected light intensity becomes smaller than the threshold value (YES in S71), the controller 60 performs the steps S20 and S30. Through the steps, the slurry is supplied inside the carrier 20, so that the rate of wavelength change in reflected light intensity increases. In other words, the polishing speed to the substrate W increases to recover.

Thereafter, until polishing completes (NO in S65), the steps S20 to S71 are repeated. The operation to be performed when polishing completes (YES in S65) is the same as that of the first embodiment.

(Modification 6)

The parameter may be the time from the halt of slurry supply in a manner like in the first embodiment. In this case, the controller 60 cyclically performs the steps S20 to S60. The parameter may be the time from the start of polishing the substrate W. Also in this case, the controller 60 can cyclically perform the steps S20 to S60 based on the time from the start of polishing the substrate W.

Also the modifications described above can achieve the same effect as that of the first embodiment. Moreover, the controller 60 can automatically move the second retainer ring R2 with respect to the first retainer ring R1 by controlling the actuator 70 with comparison of the parameter with a threshold value. Furthermore, the controller 60 can automatically perform the supply of slurry and the halt of supply.

Irrespective of the parameters, the controller 60 may move the second retainer ring R2 with respect to the first retainer ring R1 to perform the supply of slurry and the halt of supply, in accordance with an operator's instruction. In this case, the sensor 50 is not required, so that the polishing apparatus 1 can have a relatively simple configuration.

(Second Embodiment)

Figure 9:
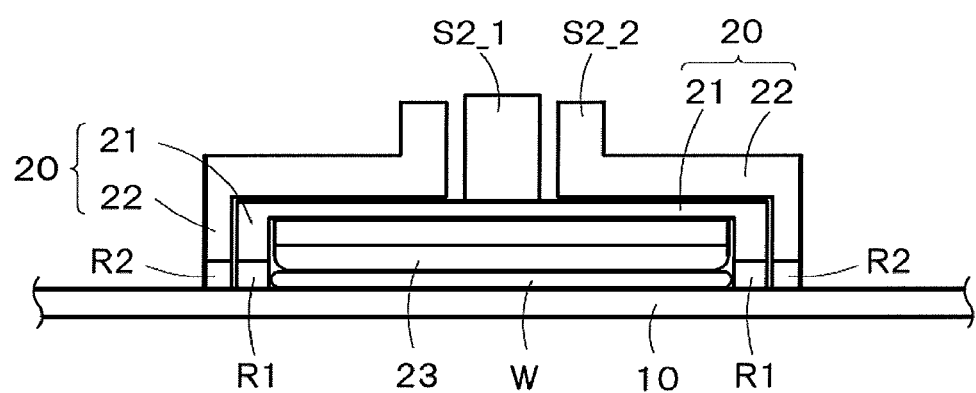
FIG. 9 is a sectional view showing an example of the configuration of a carrier according to a second embodiment.

FIG. 9 is a sectional view showing an example of the configuration of a carrier 20 according to a second embodiment. In the second embodiment, the first retainer ring R1 is rotated with a shaft S2_1 and the second retainer ring R2 is rotated with a shaft S2_2 different from that of the first retainer ring R1. In this case, the first and second retainer rings R1 and R2 are driven be different motors. However, the motors for driving the first and second retainer rings R1 and R2 are in synchronism with each other, except for moving the first and second retainer rings R1 and R2 in relative movement. Therefore, the operations of the first and second retainer rings R1 and R2 are the same as those of the first embodiment.

Between the states illustrated in FIGS. 4A and 4B, when the first and second retainer rings R1 and R2 are moved in relative movement, the rotation speed of the first retainer ring R1 may be varied with respect to the rotation speed of the second retainer ring R2. Conversely, the rotation speed of the second retainer ring R2 may be varied with respect to the rotation speed of the first retainer ring R1. In other words, either one of the first and second retainer rings R1 and R2 may be moved in the direction A2 relative to the other.

The other configuration and operation of the second embodiment may be the same as those of the first embodiment. Therefore, the second embodiment can achieve the same effect as that of the first embodiment.

Moreover, according to the second embodiment, the second retainer ring R2 is not connected to the first retainer ring R1 via an actuator. Therefore, although a motor for driving the shaft S2_2 is added, the actuator 70, the concave part C1, and the convex part C2 are not required, and hence the carrier 20 can have a relatively simple configuration entirely.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor manufacturing apparatus comprising:
a polisher polishing a substrate;
a holder holding the substrate and rotating the substrate with respect to the polisher while pressing the substrate toward the polisher;
a supplier supplying a polishing solution onto the polisher;
a first annular part attached to the holder, the first annular part being located between the holder and the polisher, and around the substrate, when polishing the substrate; and
a second annular part attached to the holder, the second annular part being located around the first annular part and between the holder and the polisher, when polishing the substrate,
wherein the first annular part is movable relative to the second annular part or the second annular part is movable relative to the first annular part, in a rotation direction of the substrate or the holder.

2. The semiconductor manufacturing apparatus according to claim 1, wherein the first annular part comprises a plurality of first trenches on a contact surface of the first annular part with respect to the polisher, the first trenches being provided from an inner surface of the first annular part to an outer surface of the first annular part, and
the second annular part comprises a plurality of second trenches on a contact surface of the second annular part with respect to the polisher, the second trenches being provided from an inner surface of the second annular part to an outer surface of the second annular part.

3. The semiconductor manufacturing apparatus according to claim 2, wherein a gap between the first trenches adjacent to each other is larger than a width of one of the second trenches and a gap between the second trenches adjacent to each other is larger than a width of one of the first trench.

4. The semiconductor manufacturing apparatus according to claim 2, wherein, a first opening and a second opening communicate with each other between the inner surface of the first annular part and the outer surface of the second annular part, or the first and second openings are closed by a side surface of the first or the second annular part, by movement of the first or the second annular part, when polishing the substrate, the first opening being formed by one of the first trenches and the polisher, and the second opening being formed by one of the second trench and the polisher.

5. The semiconductor manufacturing apparatus according to claim 3, wherein, a first opening and a second opening communicate with each other between the inner surface of the first annular part and the outer surface of the second annular part, or the first and second openings are closed by a side surface of the first or the second annular pan, by movement of the first or the second annular part, when polishing the substrate, the first opening being formed by one of the first trenches and the polisher, and the second opening being formed by one of the second trench and the polisher.

6. The semiconductor manufacturing apparatus according to claim 4, wherein, in polishing the substrate, the supplier supplies the polishing solution when the first and second openings communicate with each other and halts supply of the polishing solution when the first and second openings are closed.

7. The semiconductor manufacturing apparatus according to claim 5, wherein, in polishing the substrate, the supplier supplies the polishing solution when the first and second openings communicate with each other and halts supply of the polishing solution when the first and second openings are closed.

8. The semiconductor manufacturing apparatus according to claim 1 further comprising:

a sensor provided to the polisher or the holder, the sensor detecting a parameter that indicates a polished state of the substrate;

a driver driving the first or the second annular part in relative movement in the rotation direction; and a controller controlling the supplier and the driver, wherein the controller moves the first or the second annular part in relative movement based on the parameter.

9. The semiconductor manufacturing apparatus according to claim 2 further comprising:

a sensor provided to the polisher or the holder, the sensor detecting a parameter that indicates a polished state of the substrate;

a driver driving the first or the second annular part in relative movement in the rotation direction; and a controller controlling the supplier and the driver, wherein the controller moves the first or the second annular part in relative movement based on the parameter.

10. The semiconductor manufacturing apparatus according to claim 3 further comprising:

a sensor provided to the polisher or the holder, the sensor detecting a parameter that indicates a polished state of the substrate;

a driver driving the first or the second annular part in relative movement in the rotation direction; and a controller controlling the supplier and the driver, wherein the controller moves the first or the second annular part in relative movement based on the parameter.

11. The semiconductor manufacturing apparatus according to claim 4 further comprising:

a sensor provided to the polisher or the holder, the sensor detecting a parameter that indicates a polished state of the substrate;

a driver driving the first or the second annular part in relative movement in the rotation direction; and a controller controlling the supplier and the driver, wherein the controller moves the first or the second annular part in relative movement based on the parameter.

12. The semiconductor manufacturing apparatus according to claim 1 further comprising a driver provided between the first and second annular parts, the driver driving the first and second annular parts in relative movement.

13. The semiconductor manufacturing apparatus according to claim 12, wherein the driver drives the first and second annular parts in relative movement when the supplier supplies the polishing solution or when the supplier halts supply of the polishing solution.

14. The semiconductor manufacturing apparatus according to claim 1 further comprising:

a first shaft rotating the first annular part; and a second shaft rotating the second annular part, wherein the first and second shafts rotate in synchronism with each other, except that the first and second annular parts are moved in relative movement.

15. A semiconductor manufacturing method using a semiconductor manufacturing apparatus comprising a polisher polishing a substrate, a holder holding the substrate and rotating the substrate with respect to the polisher while pressing the substrate toward polisher, a supplier supplying a polishing solution on the polisher, a first annular part attached to the holder, the first annular part being located around the substrate and between the holder and the polisher when the substrate is being polished, and a second annular part attached to the holder, the second annular part being located around the first annular part and between the holder and the polisher when the substrate is being polished, wherein the first or second annular part is moved in relative movement based on a parameter that indicates a polished state of the substrate, wherein the parameter is any one of factors that are temperature or vibration of the substrate while being polished, temperature or vibration of a first retainer ring, temperature or vibration of a second retainer ring, a current value or an eddy current value consumed by a driver, reflected light intensity on a polished surface of the substrate, a time period from start of polishing the substrate, a time period from halt of slurry supply, or a combination of any of the factors.

* * * * *